United States Patent
Ren et al.

(10) Patent No.: US 12,193,277 B2
(45) Date of Patent: Jan. 7, 2025

(54) LIGHT-EMITTING DEVICE

(71) Applicant: Najing Technology Corporation Limited, Zhejiang (CN)

(72) Inventors: Huajin Ren, Zhejiang (CN); Xinyan Gu, Zhejiang (CN); Changgua Zhen, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 0 days.

(21) Appl. No.: 17/769,342

(22) PCT Filed: Oct. 10, 2020

(86) PCT No.: PCT/CN2020/120232
§ 371 (c)(1),
(2) Date: Apr. 15, 2022

(87) PCT Pub. No.: WO2021/073459
PCT Pub. Date: Apr. 22, 2021

(65) Prior Publication Data
US 2024/0147764 A1 May 2, 2024

(30) Foreign Application Priority Data
Oct. 16, 2019 (CN) .......................... 201910984674.2

(51) Int. Cl.
*H10K 59/122* (2023.01)
*H10K 59/80* (2023.01)

(52) U.S. Cl.
CPC .......... *H10K 59/122* (2023.02); *H10K 59/877* (2023.02)

(58) Field of Classification Search
None
See application file for complete search history.

(56) References Cited

FOREIGN PATENT DOCUMENTS

| CN | 102044555 A | 5/2011 |
|---|---|---|
| CN | 104576703 A | 4/2015 |
| CN | 104952899 A | 9/2015 |
| CN | 106067516 A | 11/2016 |
| CN | 106981502 A | 7/2017 |
| CN | 107634084 A | 1/2018 |

OTHER PUBLICATIONS

English translation of CN106981502 (Year: 2017).*
English translation of CN104576703 (Year: 2015).*

* cited by examiner

*Primary Examiner* — Bo B Jang
(74) *Attorney, Agent, or Firm* — Samson G. Yu

(57) ABSTRACT

The present disclosure provides a light-emitting device. The light-emitting device includes a substrate layer and pixel isolation structures disposed on a first surface of the substrate layer, a plurality of sub-pixel regions isolated from each other are formed between the pixel isolation structures, and the light-emitting device further include a plurality of light-emitting units disposed one-to-one in each of the sub-pixel regions for emitting different wavelengths of light, the light-emitting units being electroluminescent devices, and an initial external quantum efficiency of each of the light-emitting units being different; a plurality of light extraction structures disposed one-to-one in at least part of the plurality of sub-pixel regions for increasing an external quantum efficiency of the corresponding light-emitting unit, reducing deviations of the actual external quantum efficiency of each of the light-emitting units.

19 Claims, No Drawings

LIGHT-EMITTING DEVICE

CROSS REFERENCE TO RELATED APPLICATIONS

This application is a national application of PCT/CN2020/120232, filed on Oct. 10, 2020. The contents of PCT/CN2020/120232 are all hereby incorporated by reference.

TECHNICAL FIELD

The present disclosure relates to the field of optics, and in particular, to a light-emitting device.

BACKGROUND

With the development of science and technology, OLED (organic light emitting diode) has attracted much attention due to vivid color, fast response and thinness, making the traditional LCD (liquid crystal display) market threatened, so major manufacturers have introduced quantum dot materials into the backlight module of the traditional LCD and rolled out quantum dot TV to improve color gamut of the display devices.

In the prior art, OLED suffers from serious burn-in issue, reflecting the lifetime of OLED is not long enough, especially caused by the blue sub-pixels, which have the highest degradation rate.

In order to solve the problem that the blue sub-pixels have lower power efficiency and higher degradation rate, the below universal techniques have been proposed, but the inventors of this disclosure believe that these techniques remain problems.

1. Increasing blue sub-pixel area, for example, the area of blue sub-pixel is generally designed to be 1.5 to 2 times as big as the red, or green sub-pixel, but the lifetime prolongation of the device is less significant, the reason is that the luminous efficiency of RGB sub-pixels is not high enough, and the variability of the area and the arrangement of the sub-pixels is not large due to requirements of pixel density and algorithmic rendering, so the improvement space is very limited.

2. Applying the same light extraction structure to increase the luminous efficiency of the light-emitting device, however the degradation of the blue sub-pixels is relatively faster, and the color performance of the light-emitting device will be greatly affected.

SUMMARY

According to one aspect of the present disclosure, a light-emitting device is provided, including a substrate layer and pixel isolation structures disposed on a first surface of the substrate layer, a plurality of sub-pixel regions isolated from each other being formed between the pixel isolation structures, and further including: a plurality of light-emitting units disposed one-to-one in each of the sub-pixel regions for emitting different wavelengths of light, the light-emitting units being electroluminescent devices, and an initial external quantum efficiency of each of the light-emitting units being different; a plurality of light extraction structures disposed one-to-one in at least part of the plurality of sub-pixel regions for increasing an external quantum efficiency of the corresponding light-emitting unit, reducing deviations of actual external quantum efficiency of each of the light-emitting units.

DETAILED DESCRIPTION

It should be noted that the embodiments of the present disclosure and the features of the embodiments may be combined with each other in case of no conflict. The disclosure will be described in detail below in conjunction with the embodiments.

As used herein, the singular forms "a," "an" and "the" are intended to include the plural forms as well, unless the context clearly indicates otherwise.

It should be understood that when an element (such as a layer, a film, a region, or a substrate) is described as being "on" another element, the element can be directly on the other element, or intervening elements may also be present.

In order to enable a person skilled in the art to have a better understanding of the solution of the present disclosure, the technical solutions in the embodiments of the present disclosure will be clearly and completely described below with reference to the figures, but obviously, the described embodiments are merely a part of the embodiments of the invention rather than all of the embodiments. All other embodiments obtained by a person of ordinary skill in the art based on the embodiments of the present disclosure without creative efforts should fall within the scope of the present disclosure.

It should be noted that the terms "first", "second", and the like in the specification and claims of the present disclosure are used to distinguish similar objects, and are not necessarily used to describe a particular order or sequence. It should be understood that the number so used may be interchangeable when appropriate to facilitate the description of embodiments of the invention disclosed herein. Furthermore, the terms "include" and "have", as well as any variants thereof are intended to cover a non-exclusive inclusion, for example, processes, methods, systems, products, or devices that include a series of steps or units are not necessarily limited to include those steps or units explicitly listed, and may include other steps or units not explicitly listed or inherent to such processes, methods, products or devices.

In the present disclosure, the term D50 is the value of particle diameter at 50% in the cumulative distribution (50% of the total particles are smaller than this size). The term D90 is the value of particle diameter at 90% in the cumulative distribution (90% of the total particles are smaller than this size).

As introduced in the background, light emitting devices such as OLED displays suffer from serious burn-in issue, which essentially shows the lifetime of the devices is not long enough, especially the blue sub-pixels having the highest degradation rate. The inventors of the present disclosure conduct researches on the above problems, and propose a light-emitting device, including a substrate layer and pixel isolation structures disposed on a first surface of the substrate layer, a plurality of sub-pixel regions isolated from each other being formed between the pixel isolation structures, the light-emitting device further includes a plurality of light-emitting units and a plurality of light extraction structures, and the light-emitting units are disposed one-to-one in the sub-pixel regions for emitting different wavelengths of light; the light extraction structures are disposed in at least part of the plurality of sub-pixel regions for increasing an external quantum efficiency of the corresponding light-emitting unit, reducing deviations of actual external quantum efficiency of each of the light-emitting units, so the final external quantum efficiencies of different light-emitting units are close. The above "at least part"

means that it is possible that not all sub-pixel regions are disposed with the light extraction structures, and of course, 100% can also be included.

The corresponding light-emitting unit means the light-emitting unit which is disposed in the same sub-pixel region with the light extraction structure.

In some embodiments, the light emitting unit can be a quantum dot electroluminescent device (QLED), or an organic electroluminescent device (OLED), or the other kind of electroluminescent device, or an electroluminescent device combined with color conversion element.

In some embodiments, the same emission wavelength of light-emitting units are arranged in the light-emitting device repeatedly, such as forming a plurality of the same red sub-pixels, a plurality of the same green sub-pixels, and a plurality of the same blue sub-pixels.

In some embodiments, at least one of the light extraction structures includes quantum dots, and the light-emitting unit corresponding to the light extraction structure including quantum dots is a blue light-emitting electroluminescent device, by combining light extraction structure containing quantum dots with the blue light-emitting electroluminescent device, efficiency loss caused by color-conversion of the quantum dots within the light extraction structure makes the final external quantum efficiency of the light-emitting unit decrease in a certain extent, so that the final external quantum efficiencies of different light-emitting units are close.

In some embodiments, the light-emitting device of the present disclosure is arranged with different light extraction structures corresponding to different light-emitting units, the final external quantum efficiencies of different light-emitting units can be optimized and close to each other, so that pixels with different colors can degraded evenly, and lifetime of the device can be improved.

The light extraction structures are disposed in at least part of the plurality of sub-pixel regions of the light emitting device. For example, from bottom to top, the light-emitting unit may include a cathode layer, an electron injection layer, an electron transporting layer, a light-emitting layer, a hole transport layer, a hole injection layer, and an anode layer, and the light extraction structure may be disposed on the light transmitting side of the light-emitting layer, or may be disposed on the non-light transmitting side, such as the side adjacent to the cathode layer (i.e. reflective cathode electrode). For example, the morphology of the light extraction structure can be a wavy shape increasing the roughness of reflective electrode, so as to improve the external quantum efficiency of the device.

In some embodiments, the light-emitting device of the present disclosure, the deviations of actual external quantum efficiency among each of the light-emitting units are within ±15%. Specifically, the deviation of actual external quantum efficiency of each light-emitting unit=(the actual external quantum efficiency of each light-emitting unit−the average value of the actual external quantum efficiencies of all light-emitting units)÷the average value of the actual external quantum efficiencies of all light-emitting units.

In some embodiments, the light-emitting device of the present disclosure, the deviations of actual external quantum efficiency among each of the light-emitting units are within ±30%.

In some embodiments, the deviations of actual external quantum efficiency among each of the light-emitting units are within ±10%.

In some embodiments, the deviations of actual external quantum efficiency among each of the light-emitting units are within ±5%.

In some embodiments, the light-emitting device includes three or more kinds of light-emitting units which emit different wavelengths of light.

In some embodiments, in order to achieve the above effect, the light-emitting unit with the highest initial (without light extraction structure) external quantum efficiency is defined as a first light-emitting unit, the light-emitting unit with the lowest initial external quantum efficiency is defined as a third light-emitting unit, and the light-emitting unit with the initial external quantum efficiency being between the first light-emitting unit and the third light-emitting unit is defined as a second light-emitting unit; the plurality of light-emitting units and the plurality of light extraction structures are disposed in one-to-one correspondence, and an improvement ratio of the external quantum efficiency of the first light-emitting unit by the light extraction structure is $X_1$, an improvement ratio of the external quantum efficiency of the second light-emitting unit by the light extraction structure is $X_2$, and an improvement ratio of the external quantum efficiency of the third light-emitting unit by the light extraction structure is $X_3$, and the $X_1$, the $X_2$ and the $X_3$ are not equal, and $$Xn = \frac{Q2 - Q1}{Q1}$$

is defined, wherein, the n is any natural number from 1 to 3 (i.e. $X_1$, $X_2$, $X_3$), the $Q_1$ is the initial external quantum efficiency of the corresponding light-emitting unit, and the $Q_2$ is the actual external quantum efficiency of the corresponding light-emitting unit. The improvement ratio means the external quantum efficiency difference resulted from applying the light extraction structure to the light-emitting device while other parameters of the device are maintained the same.

In some embodiments, $X_2=X_1=0$, $X_3>0$.
In some embodiments, $X_1=0$, $X_2>0$, $X_3>0$.
In some embodiments, $X_3>X_2>X_1$.
In some embodiments, $X_3 \leq 3$.

In some embodiments, different light extraction structures are disposed onto three different light-emitting units, the efficiency of the light-emitting units with the lowest initial external quantum efficiency can be optimized and the improvement ratio of the other two kinds of light-emitting units with higher initial external quantum efficiency can be adjusted, it enables the final external quantum efficiencies of the three different light-emitting units to be close, so that pixels with different colors can degraded evenly, and the lifetime of the light-emitting device can be improved.

In some embodiments, the external quantum efficiency improvement ratio $X_3$ of the third light-emitting unit by the light extraction structure is the highest, preferably $X_3$ is between 1.5 to 3, but is not limited thereto; the external quantum efficiency improvement ratio $X_1$ of the first light-emitting unit by the light extraction structure and the external quantum efficiency improvement ratio $X_2$ of the second light-emitting unit by the light extraction structure are both lower than $X_3$. In some embodiments, the external quantum efficiency improvement ratio $X_1$ of the first light-emitting unit is less than or equal to 2, the external quantum efficiency improvement ratio $X_2$ of the second light-emitting unit is between 1 to 2.5 ($X_2$ equals to 1 means that the actual external quantum efficiency is 200% of the initial external quantum efficiency). Using the light extraction structures to optimize the external quantum efficiency improvement ratio to the above range, it helps the first light-emitting units (e.g., emitting red light), the second light-emitting units (e.g., emitting green light) and the third light emitting units (e.g., emitting blue light) to reach similar or the same actual external quantum efficiency.

In some embodiments, the first light-emitting unit may be a light-emitting unit that emits red light in the light-emitting device, and the second light-emitting unit may be a light-emitting unit that emits green light in the light-emitting device, and the third light-emitting unit may be a light-emitting unit that emits blue light in the light-emitting device. In general, the initial external quantum efficiencies of the first light-emitting unit emitting red light, the second light-emitting unit emitting green light and the third light-emitting emitting blue light decrease sequentially, but under some exceptional circumstances, the initial external quantum efficiencies of them may close to each other, or the latter being higher than the former. The light-emitting device may be an RGB (red, green, blue) light-emitting device, or the RGBW (red, green, blue, white) light-emitting device, light extraction structures with different external quantum efficiency improvement ratios are corresponding to different light-emitting units, so that the final external quantum efficiencies of the light-emitting units can be close to each other.

Since the initial external quantum efficiencies of the R, G, B light-emitting units decrease sequentially in the RGB light-emitting device, the external quantum efficiency improvement ratios should increase sequentially; but under some exceptional circumstances, the initial external quantum efficiency of the red light-emitting unit (which can be the first light-emitting unit of the present disclosure) is not high enough, so the external quantum efficiency improvement ratio of it should be increased to a higher value which is even higher than blue light-emitting unit (which can be the third light-emitting unit of the present disclosure).

In some embodiments, in order to get different external quantum efficiency improvement ratio of the light-emitting units, the light extraction structure can be a light scattering layer having scattering particles, and the light scattering layers corresponding to the first light emitting unit, the second light emitting unit and the third light emitting are different. In some embodiments, D50 of the scattering particles in the light scattering layers is within a range of 150 to 350 nm, preferably within 220 to 245 nm; in some embodiments, D90 of the scattering particles in the light scattering layers is within 150 to 350 nm, preferred within 220 to 245 nm.

In some embodiments, scattering particles in the light extraction structure include, but are not limited to, one or a combination of zinc oxide, aluminum oxide, zirconium oxide and titanium oxide, etc. Other ingredients in the light extraction structures can also include one or a combination of additives, polymers and curable adhesive, etc. The refractive index of the above-mentioned other ingredients is different from the refractive index of the scattering particles, preferably, the refractive index difference between other ingredients and the scattering particles is quite large. The above-mentioned light extraction structure can be made by inkjet printing, screen printing, spray or slit coating. In the inkjet printing process, different thickness of light extraction structures can be obtained by adjusting the amount of printing material; in the screen printing process, different thickness of light extraction structures can be obtained by adjusting the proportion of the screen opening which controls the amount of material to be printed.

In some embodiments, in order to adjust external quantum efficiency improvement ratio, the thickness of the light extraction structures with scattering particles is adjusted, meanwhile, the volume percentage, the particle size and the refractive index of the scattering particles in each light extraction structure are maintained the same, the thickness of the light extraction structure corresponding to the first light-emitting unit is defined as $H_1$, the thickness of the light extraction structure corresponding to the second light-emitting unit is defined $H_2$, the thickness of the light extraction structure corresponding to the third light-emitting unit is defined as $H_3$, $H_1$, $H_2$, $H_3$ are not equal.

It should be noted that the volume percentage mentioned in this disclosure is not absolutely identical, and it is understood that the deviation of the volume percentage of the scattering particles in each light extraction structure can be in a range of ±10%; likewise, the particle size and the refractive index mentioned in the present disclosure are not absolutely identical, the deviation of the particle size of the scattering particles in each light extraction structure can be in a range of ±10%, the deviation of the refractive index of the scattering particles in each light extraction structure can be in a range of ±10%. Besides, the volume percentage mentioned in the present disclosure is measured after the light extraction structure is formed by drying or curing.

In some embodiments, in order to ensure the same volume percentage of the scattering particles in each of the light extraction structures, the scattering particles in each of the light extraction structures have the same size distribution, meanwhile, it is preferable that each ingredient in the ink forming the light extraction structure has the same weight ratio, but it should be noted that the ink forming each light extraction structure may have different solid contents, for example, there are three ingredients A, B, C in the ink, in order to obtain 500 nm thickness of the light extraction structure, the weight ratio of them can be A:B:C=1:2:3, and a total solid content of the ink is 6%, meanwhile, the weight ratio of them also can be A:B:C=2:4:6, and a total solid content of the ink is 12%.

In some embodiments, in order to obtain the first light-emitting unit, the second light-emitting unit, and the third light-emitting unit having similar or the same external quantum efficiency, the $H_1$, the $H_2$ and the $H_3$ increase sequentially, preferably $H_1 \leq 300$ nm, $H_2 \leq 500$ nm, $H_3 \leq 1000$ nm; otherwise, the $H_1$, the $H_2$ and the $H_3$ decrease sequentially, preferably $H_1 \geq 1500$ nm, $H_2 \geq 1200$ nm, $H_3 \geq 1000$ nm.

In some embodiments, the $H_1$, the $H_2$ and the $H_3$ increase sequentially, $H_3 \leq 1000$ nm, as the thickness of each light extraction structure increases, the actual external quantum efficiency of each of the corresponding light-emitting unit increases; or, the $H_1$, the $H_2$ and the $H_3$ decrease sequentially, $H_3 \geq 1000$ nm, as the thickness of each light extraction structure decreases, the actual external quantum efficiency of each of the corresponding light-emitting unit increases. That is to say, when the particle size of scattering particles is in the range of present disclosure, each of the light-emitting unit can get a higher actual external quantum efficiency when the thickness of the light extraction structures get closer to 1000 nm.

In some embodiments, the light-emitting device of the present disclosure may further include a first intermediate layer, and the first intermediate layer is disposed in at least one sub-pixel regions, and the first intermediate layer is located between the light emitting unit and the light extraction structure. In some embodiments, the thickness of the first intermediate layer is 100 nm to 1 μm, and the refractive index is preferably from 1.65 to 2 The first intermediate layer can separate the top electrode layer from the light extraction structure, thereby ensuring that the top electrode is not corroded. It should be noted that, in the present disclosure, the first intermediate layer is disposed between the light-emitting unit and the light extraction structure, it also can means that only one part of the first intermediate layer is located between the light emitting unit and the light extraction structure, and the other part of it is located above the pixel isolation structure.

On the other hand, the first intermediate layer can adjust the top part of the light-emitting units to appropriate height, to be compatible with different thicknesses of the light extraction structures, which can simplify the preparation technique selection; for example, when spray or slit coating—a kind of non-selective coating technique is adopted to produce the light extraction structure, before disposing light extraction structures, the first intermediate layer can be formed firstly to lift up the light transmitting surface of the light-emitting units to varying degrees, meanwhile leaving the height space for light extraction structures, so during disposing material for light extraction structures, the sub-pixel regions become flattened after the material fills up under gravity.

In some embodiments, it is assumed that the height of the pixel isolation structure is 1.5 μm, the thickness of light extraction structures that corresponding to the first light-emitting unit, the second light-emitting unit and the third light-emitting unit is 300 nm, 500 nm and 1000 nm, respectively, if thickness of the three light-emitting units is all 200 nm, the first intermediate layer having a thickness of 1000 nm, 800 nm, and 300 nm can be firstly disposed on the first light emitting unit, the second light emitting unit and the third light emitting unit respectively, then the non-selective coating technique (like spray coating) can be adopted to form the light extraction structures. With different sub-pixel regions having different remaining space after introducing the first intermediate layers with different thicknesses, liquid materials flow into the sub-pixel regions automatically and make the surface flattened, so required thicknesses of light extraction structures can be obtained after drying; further, the pixel isolation structure can have steep sidewalls or a low surface energy, which helps light extraction materials to get into the sub-pixel regions more smoothly without sticking to the surface of the pixel isolation structure.

In some embodiments, the light-emitting device of the present disclosure may further include an encapsulation unit for encapsulating the light-emitting unit, the light-emitting device of the present disclosure may include a second intermediate layer, and the second intermediate layer is disposed in at least one sub-pixel regions, the second intermediate layer is located between the light extraction structure and the encapsulation unit. In some embodiments, the second intermediate layer has a thickness between 20 nm to 150 nm, and the refractive index is preferably 1.5 to 1.8. Since the light extraction structure is typically a structure mainly based on particles, the particles may partially "pop out" of the top surface of it, its uneven surface is unfavorable for the encapsulation unit to get tightly fitting contact with the light extraction structure, so when the second intermediate layer is disposed on one side of the light extraction structures away from the light-emitting layer, it smooths the surface of the underlying layer, helps the encapsulation unit to have tight contact with the surface and improves the encapsulation performance.

In some embodiments, the light-emitting device of the present disclosure may further include an encapsulation unit for encapsulating the light-emitting unit, the light-emitting device of the present disclosure may include a third intermediate layer, and the third intermediate layer is located between the light extraction structure and the encapsulation unit, or the third intermediate layer is located between at least one of the pixel isolation structures and the encapsulation unit, or the third intermediate layer is located above at least one of the sub-pixel areas and pixel isolation structures, and the third intermediate layer is located on one side of the encapsulation unit adjacent to the first surface. In some embodiments, the third intermediate layer has a thickness between 20 nm to 150 nm, and the refractive index is preferably 1.5 to 1.8.

In some embodiments, in order to satisfy the refractive indices of the first intermediate layer (1.65 to 2), the second intermediate layer (1.5 to 1.8) and the third intermediate layer (1.5 to 1.8), the materials of them can be independently selected from various kinds of metal oxides, preferably, the transmittance of the metal oxides in the visible light region is more than 80% more preferably no less than 90%. For example, the material of the first intermediate layer, the second intermediate layer, and the third intermediate layer can be independently selected from zinc oxide or various metal-doped zinc oxides, and the doped metal may be selected from one or a combination of Mg, Al, etc. The material of the first intermediate layer, the second intermediate layer, and the third intermediate layer may be ITO or molybdenum oxide or the like, and the first intermediate layer, the second intermediate layer and the third intermediate layer can also be obtained by curing UV monomer or its mixtures.

In some embodiments, in order to adjust external quantum efficiency improvement ratio, the volume percentages of the light extraction structures with scattering particles are adjusted, meanwhile, the thickness of each of the light extraction structures, particle diameter of the scattering particles and refractive index of the scattering particles in each of the light extraction structures are maintained the same respectively, and a volume percentage of the scattering particles of the light extraction structure corresponding to the first light-emitting unit is defined as $V_1$, a volume percentage of the scattering particles of the light extraction structure corresponding to the second light-emitting unit is defined as $V_2$, and a volume percentage of the scattering particles of the light extraction structure corresponding to the third light-emitting unit is defined as $V_3$, wherein the $V_1$, the $V_2$ and the $V_3$ are not equal, preferably $V_3 > V_2 > V_1$. It should be noted that the thickness mentioned in this disclosure is not absolutely identical, and it is understood that the deviation of the thickness of each light extraction structure can be in a range of ±10%.

In some embodiments, in order to avoid the light output decrease phenomenon caused by the relative high reflection rate of the light extraction structure after light transmitting into the light extraction structure, the thickness of the light extraction structure is inversely proportional to the volume percentage of the scattering particles, when the thickness of the light extraction structure is any specific value between 300 to 800 nm, the volume percentage of the scattering particles is between 50 to 95%; when the thickness of the light extraction structure is any specific value between 800 to 1200 nm, the volume percentage of the scattering particles is 35 to 50%; when the thickness of the light extraction structure is any specific value between 1200 to 1800 nm, the volume percentage of the scattering particles is 10 to 35%.

In other embodiments, in order to adjust external quantum efficiency improvement ratio, the refractive index of the scattering particles in the light extraction structure are adjusted, meanwhile, the thickness of each of light extraction structures, the particle size and volume percentage of the scattering particles in each light extraction structure are the same respectively, and a refractive index of the scattering particles of the light extraction structure corresponding to the first light-emitting unit is defined as $K_1$, a refractive index of the scattering particles of the light extraction structure corresponding to the second light-emitting unit is defined as $K_2$, and a refractive index of the scattering particles of the light extraction structure corresponding to the third light-emitting unit is defined as $K_3$, wherein the $K_1$, the $K_2$ and the $K_3$ are not equal. In some embodiments, $K_3>K_2>K_1$. In some embodiments, the refractive index of scattering particles is between 2 to 2.6.

In some embodiments, from bottom to top, each light-emitting unit may include a bottom electrode layer, an electroluminescent unit and a top electrode layer, the electroluminescent unit include a light-emitting layer, the light extraction structure in sub-pixel region is disposed on one side of the top electrode or bottom electrode which is far away from the electroluminescent unit. In some embodiments, the electroluminescent unit may include a bottom electrode layer and a first injection layer, a first transport layer, a light-emitting layer, a second injection layer, a second transport layer and a top electrode in sequence. The light-emitting device can be a top emission OLED or a top emission QLED device. In some embodiments, the light-emitting device is a display device.

In some embodiments, in the electroluminescent unit, when the bottom electrode layer is an anode layer, the top electrode layer is a cathode layer, the first injection layer is a hole injection layer, and the first transport layer is a hole transport layer, the second injection layer is an electron injection layer, and the second transport layer is an electron transport layer. When the bottom electrode layer is a cathode layer and the top electrode layer is an anode layer, the first injection layer is an electron injection layer, and the first transport layer is an electron transport layer, and the second injection layer is a hole injection layer, and the second transport layer is a hole transport layer.

The light-emitting device provided herein will be further described below in combination with the examples and comparative examples.

Example 1

The light-emitting device provided in this embodiment included a substrate and a pixel isolation structure disposed on the first surface of the substrate, and the pixel isolation structure had 96×3×64 sub-pixel regions, and the pixel density was 100 ppi. The drive method of the device was an active matrix display mode (red, blue, green sub-pixels can be adjusted and switched on and off independently). The light-emitting device further included a plurality of light-emitting units and a plurality of light extraction structures, and the light emitting units were disposed in one-to-one correspondence with sub-pixel regions, the number of the first light-emitting units emitting red light, the second light-emitting units emitting green light and the third light-emitting units emitting blue light were the same.

The light-emitting unit, from bottom to top sequentially included a cathode layer, an electron injection layer, an electron transport layer, a light-emitting layer, a hole transport layer, a hole injection layer and an anode layer, the cathode electrode material was Ag, the electron injection/transport material was zinc oxide, the hole injection material was polyethylene dioxythiophene:polystyrene sulfonate, the hole transport material was poly(N-vinylcarbazole), and the anode electrode material was ITO, the light-emitting layer in the first light-emitting unit was formed by drying the quantum dots ink comprising red quantum dots (CdSe/ZnS) and solvent, the light-emitting layer in the second light-emitting unit was formed by drying the quantum dots ink comprising blue quantum dots (CdZnS/ZnS) and solvent, the light-emitting layer in the second light-emitting unit was formed by drying the quantum dots ink comprising green quantum dots (CdSe/CdS) and solvent.

There's a one-to-one correspondence between the plurality of light extraction structures and the light-emitting layers, and the former was located on the upper surface of the light emitting-unit and was formed by mixing 5 wt % 6108 polymer UV adhesive, 1 wt % solsperse 32000 dispersant, 50.4 wt % scattering particles with remaining solvents and curing, and the volume percentage of scattering particles in each light extraction structure was 60%, and the scattering particles in each light extraction structure were all zinc oxide, the size of scattering particles in each light extraction structure was the same with a refractive index of 20, and the D50 was 150 nm, the thickness of the light extraction structure corresponding to the first light-emitting unit was $H_1$, the thickness of the light extraction structure corresponding to the second light-emitting unit is $H_2$, the thickness of the light extraction structure corresponding to the third light-emitting unit is $H_3$, Dektak-XT profilometer was used to test the film thickness, $H_1$=300 nm, $H_2$=500 nm, $H_3$=1000 nm.

Example 2

The difference between the light-emitting device provided in this example and Example 1 was that the D50 of the scattering particles was 245 nm.

Example 3

The difference between the light-emitting device provided in this example and Example 1 was that the D90 of the scattering particles was 150 nm.

Example 4

The difference between the light-emitting device provided in this example and Example 1 was that the D90 of the scattering particles was 245 nm.

Example 5

The difference between the light-emitting device provided in this example and Example 1 was that $H_1$, $H_2$ and $H_3$ increased sequentially, $H_1$=300 nm, $H_2$=400 nm, $H_3$=500 nm.

Example 6

The difference between the light-emitting device provided in this example and Example 1 was that $H_1$, $H_2$ and $H_3$ decreased sequentially, $H_1$=1500 nm, $H_2$=1200 nm, $H_3$=1000 nm.

Example 7

The difference between the light-emitting device provided in this example and Example 1 was: the thickness of each light extraction structure was 600 nm, and the scattering particles in each light extraction structure were zinc oxide with refractive index of 20, the particle sizes of the scattering particles in each light extraction structure were the same, and D50 was 150 nm, the volume percentage of scattering particles in light extraction structure corresponding to the first light-emitting unit was $V_1$, the volume percentage of scattering particles in the light extraction structure corresponding to the second light-emitting unit was $V_2$, the volume percentage of scattering particles in the light extraction structure corresponding to the third light-emitting unit was $V_3$, $V_3=95\%$, and $V_1=V_2=50\%$.

Example 8

The difference between the light-emitting device provided in this example and Example 7 was that the thickness of each light extraction structure was 600 nm, $V_1=50\%$, $V_2=70\%$, $V_3=95\%$.

Example 9

The difference between the light-emitting device provided in this example and Example 7 was that the thickness of each light extraction structure was 1000 nm, $V_1=35\%$, $V_2=40\%$, $V_3=50\%$.

Example 10

The difference between the light-emitting device provided in this example and Example 7 was that the thickness of each light extraction structure was 1500 nm, $V_1=10\%$, $V_2=20\%$, $V_3=35\%$.

Example 11

The difference between the light-emitting device provided in this example and Example 1 was: the thickness of each light extraction structure was 600 nm, and the volume percentage of the scattering particles in each light extraction structure was 60% and the particle sizes of the scattering particles in each light extraction structure were the same, and D50 was 150 nm, the refractive index of the scattering particles in the light extraction structure corresponding to the first light-emitting unit was $K_1$, the refractive index of the scattering particles in the light extraction structure corresponding to the second light-emitting unit was $K_2$, the refractive index of the scattering particles in the light extraction structure corresponding to the third light-emitting unit was $K_3$, $K_3=2.6$, $K_1=K_2=2$; $K_3=26$ corresponding to the scattering particle of rutile titanium dioxide, $K_1=K_2=2$, corresponding to the scattering particles of zinc oxide.

Example 12

The difference between the light-emitting device provided in this example and Example 11 was that $K_1=2$, $K_2=22$, $K_3=26$, with $K_3=2.6$ corresponding to scattering particles of rutile titanium dioxide, $K_1=2$ corresponding to scattering particles of zinc oxide, $K_2=2.2$ corresponding to scattering particles of zirconium oxide.

Comparative Example 1

The difference between the light-emitting device provided in this comparative example and Example 1 was that there was no light extraction structure in the light-emitting device.

Comparative Example 2

The difference between the light-emitting device provided in this comparative example and Example 1 was:
Each light extraction structure was formed by mixing and curing 5 wt % 6108 UV adhesive, 1 wt % dispersant solsperse 32000 and 50.4 wt % scattering particles and solvent, and the thickness of each light extraction structure was 600 nm, the volume percentage of scattering particles in the light extraction structure was 60%, and the scattering particles in each light extraction structure were zinc oxide with refractive idx of 2.0, and the particle sizes of the scattering particles in each light extraction structure were the same, and D50 was 150 nm.

Test Method of EQE (External Quantum Efficiency):

The current density-voltage curve of the light-emitting device was measured by Keithley2400, and the luminance of the light-emitting device was determined by spectrometer (QE-Pro) combined with the integrating sphere (FOIS-1). The external quantum efficiency of the light-emitting device was calculated based on the measured current density and luminance.

The R, G, B sub-pixels of the light-emitting devices of the above Examples 1 to 12 and the Comparative Example 1 to 2 were operated independently and the external quantum efficiencies of them were tested accordingly, after 5000 h aging test at 1000 nits of white light emission (which was made up of 300 nits of red light, 600 nits of green light and 100 nits of blue light), the R, G, B sub-pixels of the light-emitting devices were operated independently and tested again, and the results were shown in the following table.

| Item | Before aging | | | After 5000 hours of aging | | |
|---|---|---|---|---|---|---|
| | R: EQE % | G: EQE % | B: EQE % | R: EQE % | G: EQE % | B: EQE % |
| Example 1 | 12.1% | 11.9% | 10.5% | 9.7% | 9.5% | 8.2% |
| Example 2 | 12.9% | 12.5% | 11.8% | 10.3% | 10.0% | 9.2% |
| Example 3 | 11.7% | 11.2% | 10.3% | 9.4% | 9.0% | 8.0% |
| Example 4 | 13.2% | 12.8% | 12% | 10.6% | 10.2% | 9.4% |
| Example 5 | 11.5% | 10.9% | 9.5% | 9.2% | 8.7% | 7.4% |
| Example 6 | 12.3% | 11.8% | 11.1% | 9.8% | 9.4% | 8.7% |
| Example 7 | 11.7% | 11.2% | 11.6% | 9.4% | 9.0% | 9.0% |
| Example 8 | 11.6% | 11.8% | 11.6% | 9.3% | 9.4% | 9.0% |
| Example 9 | 11.9% | 11.7% | 11.4% | 9.5% | 9.4% | 8.9% |
| Example 10 | 11.4% | 11.3% | 11.5% | 9.1% | 9.0% | 9.0% |
| Example 11 | 11.5% | 11.1% | 10.9% | 9.2% | 8.9% | 8.5% |
| Example 12 | 11.5% | 11.5% | 11% | 9.2% | 9.2% | 8.6% |
| Comparative Example 1 | 7.8% | 5.9% | 3.7% | 3.9% | 2.7% | 1.5% |

-continued

| | Before aging | | | After 5000 hours of aging | | |
|---|---|---|---|---|---|---|
| Item | R: EQE % | G: EQE % | B: EQE % | R: EQE % | G: EQE % | B: EQE % |
| Comparative Example 2 | 16.5% | 12.5% | 9% | 14.9% | 10.0% | 5.4% |

As can be seen from the above table, the external quantum efficiencies of R, G, B sub-pixels in the Comparative Example 1 decreased to approximately 50%, 45% and 30% of their initial values. In the Comparative Example 2, the initial external quantum efficiencies of R, G, B sub-pixels were at least doubled by the same light extraction structures that applied onto them, after aging test for the same period of time, the external quantum efficiencies of R, G, B sub-pixels decreased to approximately 90%, 80% and 60% of their initial values. It is can be seen that, under the same luminance, the device with higher external quantum efficiency had lower degradation rate (the initial external quantum efficiency of the Comparative Example 2 was more than one time that of the Comparative Example 1, after aging test for the same period of time, degradation rate of Comparative Example 2 was lower than Comparative Example 1), but due to light extraction improvement ratios of R, G, B sub-pixels were almost the same, the external quantum efficiency deviations among them were increased, which made the device degraded more unevenly.

In Examples 1 to 12, different light extraction structures were applied to the device, the external quantum efficiency of red light-emitting unit was increased about 0.5 times, the external quantum efficiency of green light-emitting unit was increased about 1 times, the external quantum efficiency of blue light-emitting unit was increased about 2 times, so that the final external quantum efficiencies of R,G,B sub-pixels in the light-emitting device were relatively close, after 5000 hours of aging test, the degradation rates of R, G, B sub-pixels in the light-emitting device were close too, which made the device degraded evenly.

Assuming that the external quantum efficiency of a product decays to 70% of the initial value as a qualified limit of the product, although the external quantum efficiencies of the RGB sub-pixels in Comparative Example 2 were relatively high (especially the red sub-pixel), the external quantum efficiency improvement ratio of the blue sub-pixel was insufficient, and the blue sub-pixel degraded below the 70% threshold; meanwhile, although the external quantum efficiency of red sub-pixel decreased only by 10%, the whole display belonged to unqualified product. For Examples 1 to 12, the external quantum efficiencies of R, G, B sub-pixels decreased to 80% of their initial values, which were far away from their 70% threshold, and the lifetime of the device was greatly extended.

From the above description, it can be seen that the embodiments of the present disclosure achieve the following technical effects:

In the above-described light-emitting device, different light extraction structures are disposed on different light-emitting units to optimize their external quantum efficiencies, which enables the final external quantum efficiencies of different light-emitting units to be close, helps sub-pixels with different colon degrade evenly and improves the lifetime of the device.

The above are only the preferable embodiments of the disclosure, and have no intention to limit the disclosure, it is to be noted by those skilled in the art that the disclosure may have various modifications and variations. Any modifications, equivalent replacements, improvements and the like made within the spirit and principle of the disclosure shall fall within the scope of protection of the disclosure.

What is claimed is:

1. A light-emitting device, comprising a substrate layer and pixel isolation structures disposed on a first surface of the substrate layer, a plurality of sub-pixel regions isolated from each other being formed between the pixel isolation structures, and further comprising:
    a plurality of light-emitting units disposed one-to-one in each of the sub-pixel regions for emitting different wavelengths of light, the light-emitting units being electroluminescent devices, and an initial external quantum efficiency of each of the light-emitting units being different;
    a plurality of light extraction structures disposed one-to-one in at least part of the plurality of sub-pixel regions for increasing an external quantum efficiency of the corresponding light-emitting units and reducing deviations of an actual external quantum efficiency of each of the light-emitting units,
    defining the light-emitting unit with the highest initial external quantum efficiency as a first light-emitting unit, the light-emitting unit with the lowest initial external quantum efficiency as a third light-emitting unit, and the light-emitting unit with the initial external quantum efficiency being between the highest initial external quantum efficiency of the first light-emitting unit and the lowest initial external quantum efficiency of the third light-emitting unit as a second light-emitting unit;
    the plurality of light-emitting units and the plurality of light extraction structures being disposed in one-to-one correspondence, and an improvement ratio of the external quantum efficiency of the first light-emitting unit by the light extraction structure being $X_1$, an improvement ratio of the external quantum efficiency of the second light-emitting unit by the light extraction structure being $X_2$, an improvement ratio of the external quantum efficiency of the third light-emitting unit by the light extraction structure being $X_3$, and the $X_1$, the $X_2$ and the $X_3$ being not equal, defining $XN=Q2-Q1/Q1$, wherein, the n is any natural number from 1 to 3, the $Q_1$ is the initial external quantum efficiency of the corresponding light-emitting unit, and the $Q_2$ is the actual external quantum efficiency of the corresponding light-emitting unit.

2. The light-emitting device according to claim 1, wherein the deviations of actual external quantum efficiency of each of the light-emitting units are within±15%.

3. The light-emitting device according to claim 1, wherein, $X_3 > X_2 > X_1$.

4. The light-emitting device according to claim 1, wherein the light extraction structures are light scattering layers having scattering particles, and the light scattering layers corresponding to the first light-emitting unit, the second light-emitting unit and the third light-emitting unit are different.

5. The light-emitting device according to claim 4, wherein a value of particle diameter at 50% in a cumulative distribution (D50) of the scattering particles of the light scattering layers is different.

6. The light-emitting device according to claim 5, wherein, the D50 of the scattering particles of the light scattering layers is in a range of 150 to 350 nm.

7. The light-emitting device according to claim 5, wherein a value of particle diameter at 90% in a cumulative distribution (D90) of the scattering particles of the light scattering layers is different.

8. The light-emitting device according to claim 7, wherein, the D90 of the scattering particles of the light scattering layers is in a range of 150 to 350 nm.

9. The light-emitting device according to claim 4, wherein, a volume percentage of the scattering particles, a particle diameter of the scattering particles and a refractive index of the scattering particles in each of the light scattering layers are the same respectively, and a thickness of the light extraction structure corresponding to the first light-emitting unit is defined as $H_1$, a thickness of the light extraction structure corresponding to the second light-emitting unit is defined as $H_2$, and a thickness of the light extraction structure corresponding to the third light-emitting unit is defined as $H_3$, wherein the $H_1$, the $H_2$ and the $H_3$ are not equal.

10. The light-emitting device according to claim 9, wherein, the $H_1$, the $H_2$ and the $H_3$ increase sequentially, $H_{1 \leq 300}$ nm, $H_{2 \leq 500}$ nm, $H_{3 \leq 1000}$ nm; or, the $H_1$, the $H_2$ and the $H_3$ decrease sequentially, $H_{1 \geq 1500}$ nm, $H_{2 \geq 1200}$ nm, $H_{3 \geq 1000}$ nm.

11. The light-emitting device according to claim 9, wherein, the $H_1$, the $H_2$ and the $H_3$ increase sequentially, the $H_{3 \leq 1000}$ nm, as the thickness of each of the light extraction structures increases, the actual external quantum efficiency of the corresponding light-emitting unit increases; or the $H_1$, the $H_2$ and the $H_3$ decrease sequentially, the $H_{3 \geq 1000}$ nm, as the thickness of each of the light extraction structures decreases, the actual external quantum efficiency of the corresponding light-emitting unit increases.

12. The light-emitting device according to claim 4, wherein, a thickness of each of the light extraction structures, a particle diameter of the scattering particles and a refractive index of the scattering particles in each of the light extraction structures are the same respectively, and a volume percentage of the scattering particles of the light extraction structure corresponding to the first light-emitting unit is defined as $V_1$, a volume percentage of the scattering particles of the light extraction structure corresponding to the second light-emitting unit is defined as $V_2$, and a volume percentage of the scattering particles of the light extraction structure corresponding to the third light-emitting unit is defined as $V_3$, wherein the $V_1$, the $V_2$ and the $V_3$ are not equal.

13. The light-emitting device of claim 12, wherein, the thickness of the light extraction structure is any value of 300 nm to 800 nm and the volume percentage of the scattering particles of the light extraction structures corresponding to all the light-emitting units is 50% to 95%; or, the thickness of the light extraction structure is any value of 800 nm to 1200 nm and the volume percentage of the scattering particles of the light extraction structures corresponding to all the light-emitting units is 35% to 50%; or, the thickness of the light extraction structure is any value of 1200 nm to 1800 nm and the volume percentage of the scattering particles of the light extraction structures corresponding to all the light-emitting units is 10% to 35%.

14. The light-emitting device according to claim 4, wherein, a thickness of each of the light extraction structures, a volume percentage of the scattering particles and a particle diameter of the scattering particles in each of the light extraction structures are the same respectively, and a refractive index of the scattering particles of the light extraction structure corresponding to the first light-emitting unit is defined as $K_1$, a refractive index of the scattering particles of the light extraction structure corresponding to the second light-emitting unit is defined as $K_2$, and a refractive index of the scattering particles of the light extraction structure corresponding to the third light-emitting unit is defined as $K_3$, wherein the $K_1$, the $K_2$ and the $K_3$ are not equal.

15. The light-emitting device according to claim 14, wherein the refractive index of the scattering particles of the light extraction structures corresponding to all the light-emitting units is 2 to 2.6.

16. The light-emitting device according to claim 1, the light-emitting device further comprising a first intermediate layer disposed in at least one of the sub-pixel regions, and the first intermediate layer being located between the light-emitting unit and the light extraction structure of the at least one of the sub-pixel regions.

17. The light-emitting device according to claim 1, the light-emitting device further comprising an encapsulation unit for encapsulating the light-emitting units, and a second intermediate layer disposed in at least one of the sub-pixel regions, and the second intermediate layer being located between the light extraction structure of the at least one of the sub-pixel regions and the encapsulation unit.

18. The light-emitting device according to claim 1, the light-emitting device further comprising an encapsulation unit for encapsulating the light-emitting units, and a third intermediate layer, wherein, the third intermediate layer is disposed above at least one of the sub-pixel regions and located between the light extraction structure of the least one of the sub-pixel regions and the encapsulation unit, or the third intermediate layer is disposed between at least one of the pixel isolation structures and the encapsulation unit, or the third intermediate layer is disposed above at least one of sub-pixel regions and at least one of the pixel isolation structures, and the third intermediate layer is located on a side of the encapsulation unit close to the first surface.

19. The light-emitting device according to claim 1, wherein, at least one of the light extraction structures comprises quantum dots, and the light-emitting unit corresponding to the at least one of the light extraction structures comprising quantum dots is a blue light-emitting electroluminescent device.

* * * * *